(12) United States Patent
Jeong et al.

(10) Patent No.: US 10,062,525 B2
(45) Date of Patent: Aug. 28, 2018

(54) WIRELESS SWITCH AND METHOD

(71) Applicant: SAMSUNG ELECTRO-MECHANICS CO., LTD., Suwon-si (KR)

(72) Inventors: In Wha Jeong, Suwon-si (KR); Jae Suk Sung, Suwon-si (KR); Hugh Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 227 days.

(21) Appl. No.: 15/050,965

(22) Filed: Feb. 23, 2016

(65) Prior Publication Data
US 2017/0085194 A1   Mar. 23, 2017

(30) Foreign Application Priority Data
Sep. 17, 2015   (KR) .................... 10-2015-0131565

(51) Int. Cl.
| | |
|---|---|
| H03H 3/08 | (2006.01) |
| H01H 3/08 | (2006.01) |
| H01H 19/14 | (2006.01) |
| H02N 2/18 | (2006.01) |
| H03K 17/965 | (2006.01) |
| H03K 17/967 | (2006.01) |

(52) U.S. Cl.
CPC .............. *H01H 3/08* (2013.01); *H01H 19/14* (2013.01); *H02N 2/18* (2013.01); *H03K 17/965* (2013.01); *H03K 17/967* (2013.01); *H01H 2300/03* (2013.01); *H03K 2217/94057* (2013.01); *H03K 2217/94089* (2013.01); *H03K 2217/9651* (2013.01)

(58) Field of Classification Search
CPC ................................. H01H 3/08; H02N 2/18
See application file for complete search history.

(56) References Cited

U.S. PATENT DOCUMENTS

| 3,370,259 | A  * | 2/1968 | Valdettaro | H01H 19/58 200/11 D |
|---|---|---|---|---|
| 7,084,529 | B2 * | 8/2006 | Face | H03K 17/964 307/116 |
| 2016/0241169 | A1 * | 8/2016 | Kono | G08C 17/02 |
| 2016/0294387 | A1 * | 10/2016 | Maigler | H03K 17/9622 |

FOREIGN PATENT DOCUMENTS

| JP | 2014-013735 A | 1/2014 |
|---|---|---|
| KR | 10-2002-0068773 A | 8/2002 |
| KR | 10-2011-0138471 A | 12/2011 |

* cited by examiner

*Primary Examiner* — Jeffrey Shin
(74) *Attorney, Agent, or Firm* — NSIP Law

(57) ABSTRACT

A wireless switch includes: an adjusting member configured to rotate; a rotary plate comprising a first extending bar extending from a surface of the rotary plate in a radial direction and configured to be rotated together with the adjusting member; a first deformation member configured to be deformed by the first extending bar when the rotary plate rotates to cause the first extending bar to contact the first deformation member; a first piezoelectric element disposed on the first deformation member and configured to generate electricity when the first deformation member is deformed; and a radio frequency (RF) communications module unit configured to transmit a signal according to the electricity generated by the first piezoelectric element.

20 Claims, 4 Drawing Sheets

WIRELESS SWITCH AND METHOD

CROSS-REFERENCE TO RELATED APPLICATION

This application claims the benefit under 35 USC 119(a) of Korean Patent Application No. 10-2015-0131565 filed on Sep. 17, 2015, with the Korean Intellectual Property Office, the entire disclosure of which is incorporated herein by reference for all purposes.

BACKGROUND

1. Field

The following description relates to a wireless switch and a method of operating a wireless switch.

2. Description of the Related Art

Electric lights are commonly provided in residential, commercial and industrial settings. In order to turn these electric lights on and off, it is typical to connect the electric light and a switch using wires to form a circuit that is opened or closed according to an operation of the switch.

Recently, new techniques for switching an electric light or lamp on and off and adjusting the brightness of the electric light or lamp through a wireless switch have been developed.

Typically, a battery, or the like, is required to supply electricity to the wireless switch. Thus, when the life of the battery ends, the battery needs to be replaced, inconveniencing a user.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

A wireless switch includes: an adjusting member configured to rotate; a rotary plate comprising a first extending bar extending from a surface of the rotary plate in a radial direction and configured to be rotated together with the adjusting member; a first deformation member configured to be deformed by the first extending bar when the rotary plate rotates to cause the first extending bar to contact the first deformation member; a first piezoelectric element disposed on the first deformation member and configured to generate electricity when the first deformation member is deformed; and a radio frequency (RF) communications module unit configured to transmit a signal according to the electricity generated by the first piezoelectric element.

The wireless switch may include plural deformation members, including the first deformation member, spaced apart from one another at same respective intervals interval in a circumferential direction.

Each of the plural deformation members may include a fixed portion and a deformation portion extending from the fixed portion.

The piezoelectric element may be disposed on the deformation portion and configured to be deformed together when deformation portion deforms.

The wireless switch may include plural deformation members, including the first deformation member, respectively spaced apart from one another in a circumferential direction such that spaces between adjacent deformation members are gradually increased.

The wireless switch may include plural extending bars, including the first extending bar, spaced apart from one another in the circumferential direction.

The plural extending bars may be respectively spaced apart in a circumferential direction such that spaces between adjacent extending bars are gradually increased.

The wireless switch may include a rectifier electrically connected to the first piezoelectric element and may be configured to rectify electricity generated by the first piezoelectric element.

The wireless switch may include a condenser electrically connected to the rectifier and configured to stabilize a rectified current from the rectifier and accumulate corresponding electric charges.

The wireless switch may include a converter electrically connected to the condenser and configured to convert the electricity from the condenser to a voltage supplied to the RF communications module unit.

The wireless switch may include: plural piezoelectric elements, including the first piezoelectric element; and a sensing unit electrically connected to the plural piezoelectric elements, and configured to sense generation of electricity produced by the plural piezoelectric elements.

The sensing unit may be electrically connected to a control unit; and the control unit may be configured to store electricity generated according to a signal from the sensing unit and control the RF communications module unit to generate a signal corresponding to the respective deformations of the plural piezoelectric elements.

The wireless switch may further include: plural piezoelectric elements, including the first piezoelectric element; and a sensing unit electrically connected to one or more of the plural piezoelectric elements, and configured to sense deformations of the plural piezoelectric elements.

The adjusting member may be disposed on a first side of a body.

The first deformation member may be disposed on a second side of the body opposite the first side.

A wireless switch includes: an adjusting member configured to rotate; a rotary plate including a first extending bar extending from a surface of the rotary plate in a radial direction and configured to rotate when the adjusting member rotates; a first deformation member configured to be deformed by the first extending bar when the rotary plate rotates; a first piezoelectric element disposed on the first deformation member and configured to generate electricity upon deformation of the first deformation member; a rectifier electrically connected to the first piezoelectric element and configured to rectify a current provided to the first piezoelectric element; a condenser electrically connected to the rectifier and configured to stabilize a resulting rectified current from the rectifier and accumulate corresponding electric charges; a converter configured to convert current from the accumulated corresponding electric charges to a voltage; and a radio frequency (RF) communications module unit configured to be driven by the voltage provided from the converter and selectively transmitting a signal according to the generated electricity of the first piezoelectric element.

The wireless switch may include plural deformation members, including the first deformation member, spaced apart at a same interval in a circumferential direction.

The wireless switch may include plural deformation members, including the first deformation member, respectively spaced apart in a circumferential direction such that spaces between adjacent deformation members are gradually increased.

The wireless switch may include plural extending bars, including the first extending bar. The plural extending bars may be arranged in a corresponding circumferential direction so that portions of the plural extending bars that contact the plural deformation members may be differently spaced from a nearest deformation member of the plural deformation members.

A method includes: generating electricity in a select piezoelectric element of plural piezoelectric elements in response to deformation of a deformation member, of plural deformation members of a wireless switch, by rotation of an adjusting member of the wireless switch; and controlling transmission of a radio frequency (RF) signal to an external electronic device to selectively operate the electronic device, between different operatings of the electronic device, based on differing amounts of electricity generated in response to respective deformations of the deformation members.

Other features and aspects will be apparent from the following detailed description, the drawings, and the claims.

DETAILED DESCRIPTION

Figure 1:
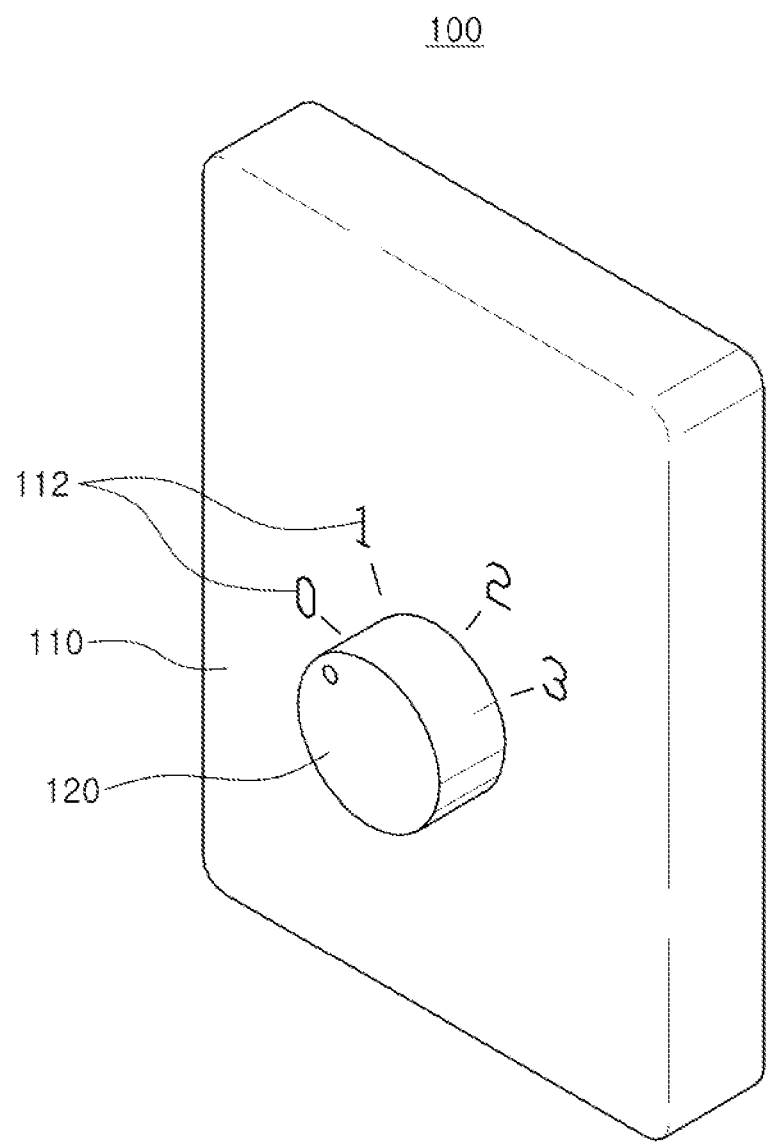
FIG. 1 is a perspective view illustrating a wireless switch according to one or more embodiments.

The following detailed description is provided to assist the reader in gaining a comprehensive understanding of the methods, apparatuses, and/or systems described herein. However, after a full understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order after a full understanding of the present disclosure. Also, descriptions of functions and constructions that are previously discussed may be omitted in subsequent discussions for increased clarity and conciseness.

The features described herein may be embodied in different forms, and are not to be construed as being limited to the examples described herein. Rather, the examples described herein have been provided so that this disclosure will be thorough and will convey a scope of the disclosure to one of ordinary skill in the art.

Throughout the specification, it will be understood that when an element is referred to as being "directly on," "directly connected to," or "directly coupled to" another element, there may be no elements or layers intervening therebetween or there may be other elements intervening therebetween, depending on embodiment. Like numerals may refer to like elements throughout. As used herein, the term "and/or" includes any and all combinations of one or more of the associated listed items.

It will be apparent that though the terms first, second, third, etc. may be used herein to describe various members and/or components, these members and/or components, should not be limited by these terms. These terms are only used to distinguish one member, component, region, layer or section from another region, layer or section. Thus, a first member, component, region, layer or section discussed below could be termed a second member, component, region, layer or section without departing from the embodiments.

Spatially relative terms, such as any of "above," "upper," "below," and "lower" and the like, may be used herein for ease of description to describe one element's relationship to another element(s) as shown in the figures. It will be understood such spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the embodiments. As used herein, the singular forms "a," "an," and "the" are intended to include the plural forms as well, unless the context clearly indicates otherwise. It will be further understood that the terms "includes," "including," "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments will be described with reference to schematic views. In the drawings, for example, due to manufacturing techniques and/or tolerances, modifications of the shape shown may be estimated. Thus, embodiments should not be construed as being limited to the particular shapes of regions shown herein, for example, to include a change in shape results in manufacturing. The following embodiments may also be constituted by one or a combination thereof.

The contents described below may have a variety of configurations and propose only example configurations herein, and are thus not limited thereto.

Figure 2:
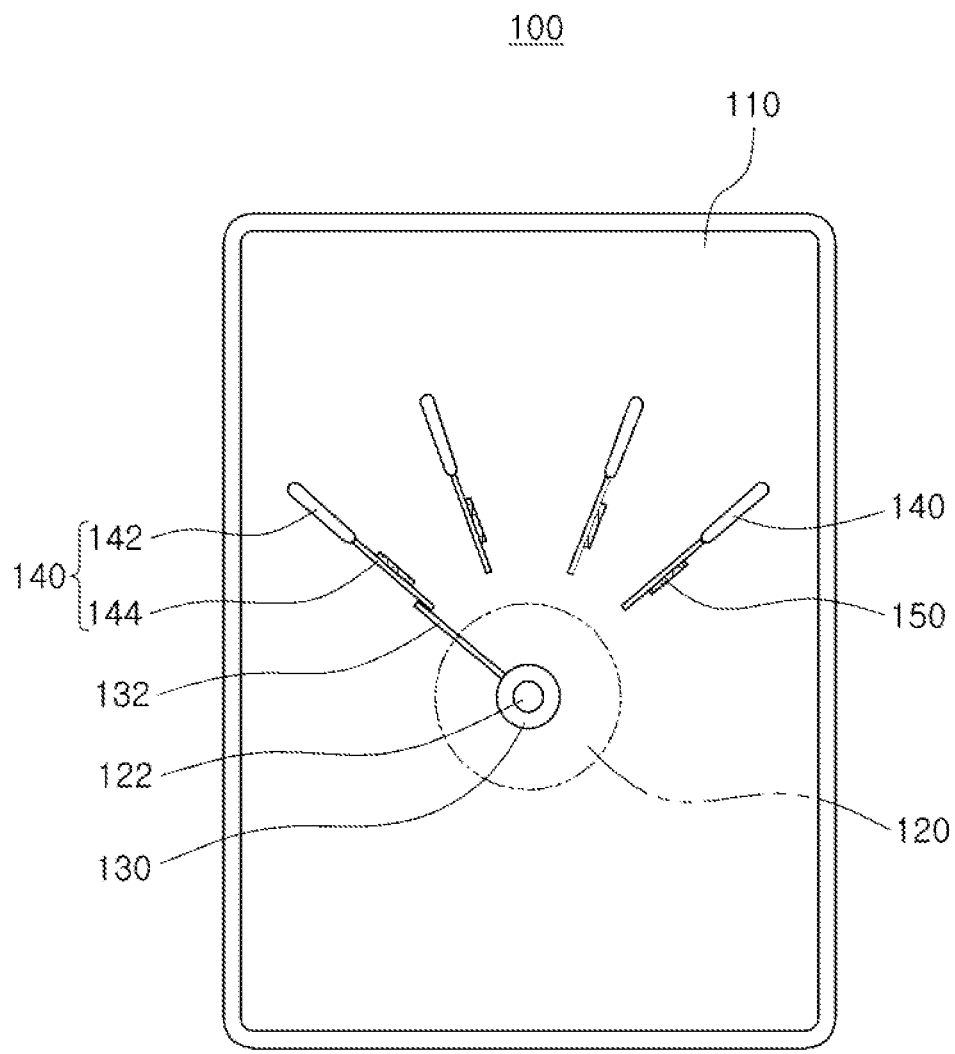
FIG. 2 is a plan view illustrating an internal configuration of a wireless switch according to one or more embodiments.
Figure 3:
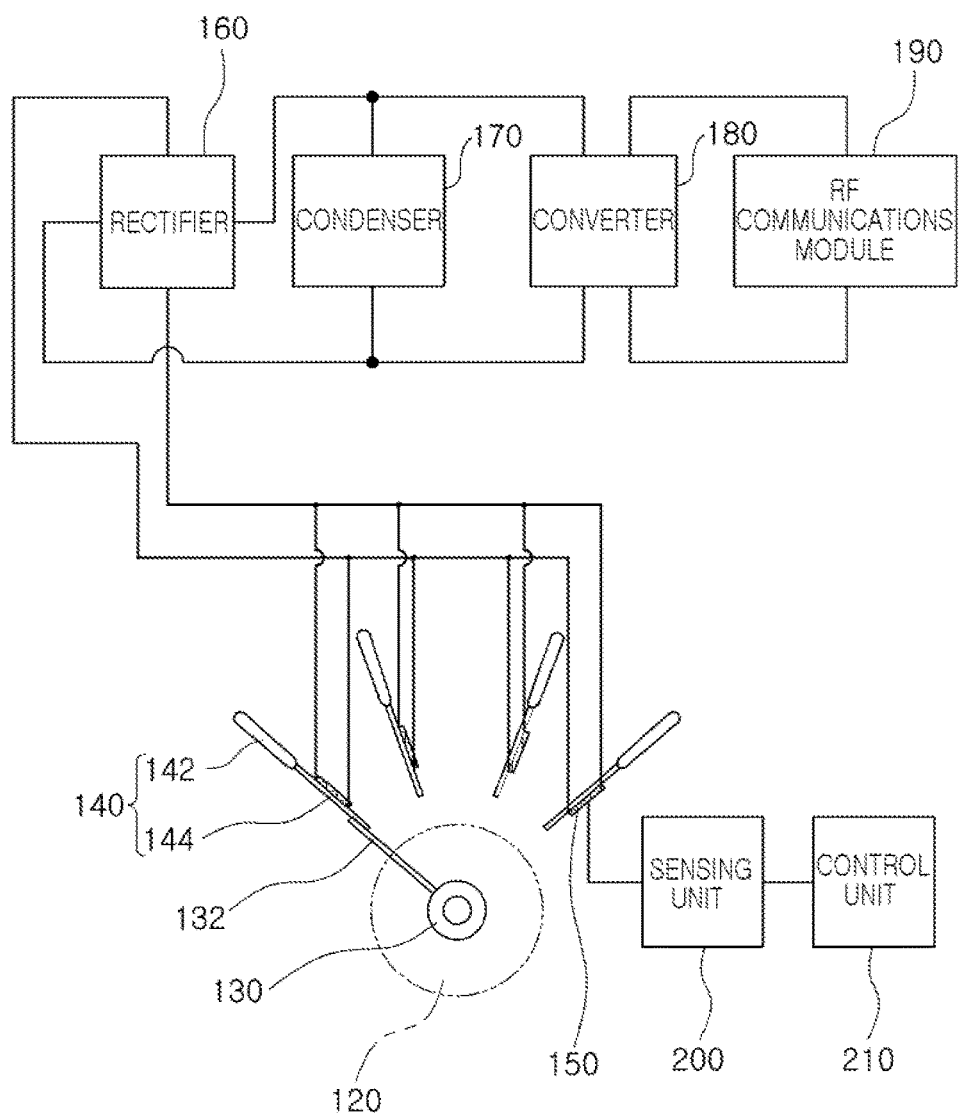
FIG. 3 is a block diagram illustrating a configuration of a wireless switch according to one or more embodiments.

FIG. 1 is a perspective view illustrating a wireless switch according to one or more embodiments. FIG. 2 is a plan view illustrating an internal configuration of a wireless switch according to one or more embodiments. FIG. 3 is a block diagram illustrating a configuration of a wireless switch according to one or more embodiments. Below, FIGS. 1-3 will be discussed together only for convenience of explanation.

Referring to FIGS. 1, 2, and 3, a wireless switch 100 may include a main body 110, an adjusting member 120, a rotary plate 130, a deformation member 140, a piezoelectric element 150, a rectifier 160, a condenser 170, a converter 180, a radio frequency (RF) communications module unit 190, a sensing unit 200, and a control unit 210, for example.

As illustrated in FIG. 1, the main body 110 may form an outer surface of the wireless switch 100 and has an internal space. The wireless switch 100 may have a rectangular shape, but is not limited thereto. For example, the wireless switch 100 may have a circular shape or a dome shape, or another shape.

An indicator 112 indicating an amount (degree) of rotation of the adjusting member 120 may be formed on an upper surface of the main body 110. For example, as shown in FIG. 1, the indicator 112 may have values 0, 1, 2, and 3, and these numbers may be disposed to be spaced apart from one another at the same interval, but embodiments are not limited thereto.

Through the indicator 112, the user may recognize an amount of rotation of the adjusting member 120.

As mentioned above, a case in which the indictor 112 has numbers from 0 to 3 is described, but the values of the indicator are not limited thereto and the indicator 112 may have values displayed, for example, that are greater than 3, or the indicator may not include numbers at all.

The adjusting member 120 is rotatably disposed on the main body 110, and may be operated by the user to rotate the rotary plate 130. The adjusting member 120 may accommodate a rotational shaft 122 and may be connected to the rotary plate 130, for example. Thus, the adjusting member 120 and the rotary plate 130 may be rotated together. Although FIG. 1-3 show adjusting member 120 on an opposite side of main body 110 as the rotary plate 130 and other components, embodiments are not limited thereto. For example, according to embodiments, adjusting member 120 and rotary plate 130 may be disposed on a same side of main body 110, or main body 110 may not be present.

Although not shown, a mark such as a dot allowing for recognition of an amount of rotation of the adjusting member 120 may also be included on adjusting member 120.

That is, upon recognition of where the mark of the adjusting member 120 is disposed in the indicator 112 of the main body 110, the user may recognize an amount of rotation of the adjusting member 120, as indicated by the corresponding value of indicator 112.

The rotary plate 130 has an extending bar 132, for example, extending from an outer circumferential surface in a radial direction and may be rotated together with the adjusting member 120. That is, the rotary plate 130 may be rotated together with the adjusting member 120 as the user operates the adjusting member 120, e.g., to deform the deformation member 140 through the extending bar 132. For example, when the rotary plate 130 is rotated, the extending bar 132 comes into contact with the deformation member 140, deforming the deformation member 140 in a rotation direction.

Accordingly, in one or more embodiments, deformation member 140 is disposed in the internal space of the main body 110, and is deformed by the extending bar 132 when the rotary plate 130 is rotated. The deformation member 140 may have a fixed portion 142 fixedly disposed on the main body 110 and a deformation portion 144 extending from the fixed portion 142.

That is, when pressure is applied to deformation portion 144 of the deformation member 140 by the extending bar 132, the deformation portion 144 is curved in a rotation direction of the extending bar 132.

A plurality of deformation members 140 may be disposed to be spaced apart from one another at the same interval in a circumferential direction, for example, and, may correspond to the numbers (values) of indicator 112.

Here, the circumferential direction refers to a direction of rotation along an outer circumferential surface of the adjusting member 120.

According to FIG. 2, for example, four deformation members 140 are provided, but the number of the deformation members is not limited thereto and three or less or four or more deformation members 140 may be provided.

The piezoelectric element 150 is disposed on the deformation member 140 and may generate electricity when the deformation member 140 is deformed. For example, the piezoelectric element 150 may be disposed on the deformation portion 144 and deformed together with the deformation portion 144 to convert mechanical energy into electrical energy.

In other words, in a case in which the user rotates the adjusting member 120, the extending bar 132 of the rotary plate 130 rotated by the adjusting member 120 deforms the deformation portion 144 of the deformation member 140. Accordingly, the piezoelectric element 150 may be curved in a rotation direction of the extending bar 132 and may generate electrical energy.

The piezoelectric element 150 is installed in each of the plurality of deformation members 140.

Figure 4:
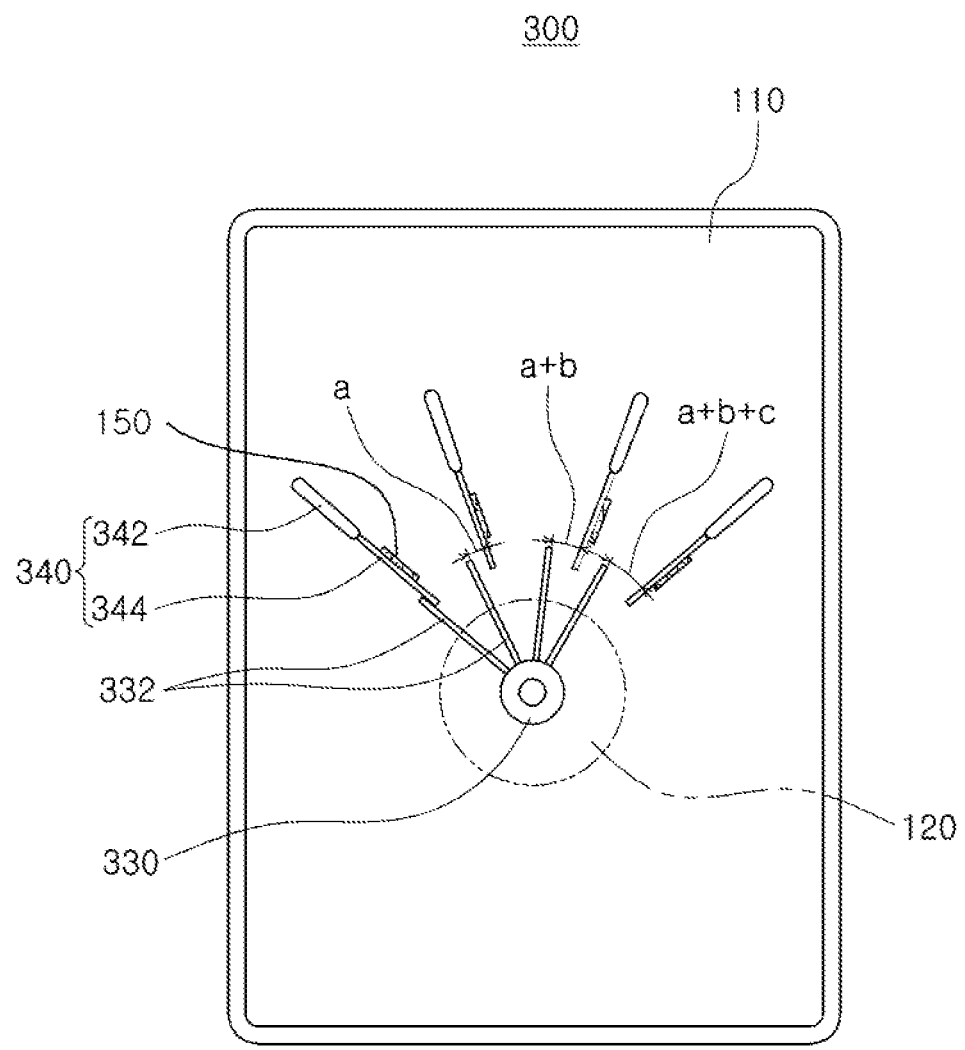
FIG. 4 is a plan view illustrating an internal configuration of a wireless switch according to one or more embodiments.

Such piezoelectric elements 150 are illustrated, in FIGS. 2-4, as having the same size in the drawings but the piezoelectric elements 150 may also be formed to have different sizes. That is, the piezoelectric elements 150 may be formed to have different sizes, e.g., so that magnitudes (amount) of electricity generated by the piezoelectric elements 150 may be different.

The rectifier 160 is connected to the piezoelectric element 150. The rectifier 160 may rectify a current generated by the piezoelectric element 150.

The condenser 170 is connected to a rear (or resulting rectified) stage of the rectifier 160 and may stabilize a rectified current from the rectifier 160 and accumulate electric charges through a difference in potentials.

The converter 180 is connected to the condenser 170 and may provide electricity having a predetermined voltage to the RF communications module unit 190.

Thus, the RF communications module unit 190 may transmit a signal according to an amount of rotation of the adjusting member 120 by the user to a reception communications module in a wireless switch system embodiment that includes the wireless switch and the reception communication module. According to this signal, for example, an electric light or lamp may be dimmed, brightened, turned on, or turned off, as examples. The RF communications module unit 190 may be connected to the control unit 210.

The sensing unit 200 (i.e. sensor, sensing part) is connected to the piezoelectric element 150 and may sense whether electricity is generated by the piezoelectric element 150. The sensing unit 200 is connected to the control unit 210 (i.e. controller, control part), and may sense which of the plurality of piezoelectric elements 150 generates electricity, and may transmit a corresponding signal to the control unit 210.

In FIG. 3, it is illustrated that the sensing unit 200 is connected to any one of the piezoelectric elements 150, but the sensing unit 200 may be connected to all or only some of the piezoelectric elements 150, depending on an embodiment.

The control unit 210 is connected to the converter 180, the RF communications module unit 190, and, thus, the sensing unit 200 may control an operation of the RF communications module unit 190. That is, the control unit 210 may control the RF communications module unit 190 to transmit a signal according to a signal from the sensing unit 200.

An operation of the wireless switch 100 will be described below.

First, when the user rotates the adjusting member 120, the rotary plate 130 is rotated together with the adjusting member 120. Accordingly, the example extending bar 132 of the rotary plate 130 is rotated together with the rotary plate 130 to deform one end portion of the deformation member 140.

That is, when the deformation portion 144 of the deformation member 140 is deformed, the piezoelectric element 150 disposed on the deformation portion 144 is also deformed together with the deformation portion 144 to generate electricity.

The sensing unit 200 connected to the piezoelectric elements 150 senses which of the plurality of piezoelectric elements 150 generates electricity, and transmits a corresponding signal to the control unit 210.

The control unit 210 may supply power from the converter 180 to the RF communications module unit 190 according to the signal to enable the RF communications module unit 190 to transmit a signal to the reception communications module.

As a result, the user may adjust dimming of a lamp, or the like (as described above), by rotating the adjusting member 120. As another example, the wireless switch may control which of differing devices or operation are selectively implemented.

As described above, the wireless switch 100 may be driven using electricity generated by the piezoelectric elements 150.

Accordingly, the wireless switch 100 may have a simple structure, enhancing product reliability and increasing lifespan.

In the above, the case in which the wireless switch is used as a dimming switch of a lamp, or the like, is described, but the purpose of the wireless switch is not limited thereto and may be used in various fields such as an audio volume controller, a cooling/heating temperature/ventilation adjuster, or a feed water regulator, again noting that further alternatives are available.

In one or more of aforementioned embodiments, a case in which the sensing unit 200 is included is an example, but embodiments are not limited thereto. For example, electricity generated by the piezoelectric elements 150 may be transmitted directly to the RF communications module unit 190 through the rectifier 160 and the converter 180 to transmit a signal to the reception communications module.

Hereinafter, a wireless switch according to one or more embodiments will be described with reference to FIG. 4. Here, the components the same as or like those described above will be denoted by the same reference numerals in the drawings and a detailed description thereof will be omitted.

FIG. 4 is a plan view illustrating an example of an internal configuration of a wireless switch, according to one or more embodiments.

Referring to FIG. 4, a rotary plate 330 of a wireless switch 300 according to an embodiment has a plurality of extending bars 332 extending from an outer circumferential surface of the rotary plate 330 in a radial direction and may be rotated together with the adjusting member 120. The plurality of extending bars 332 may be disposed to be spaced apart from one another at a same interval in a circumferential direction, for example. Additionally or alternatively, one or more of the extending bars may be differently spaced apart.

As the user operates the adjusting member 120, the plurality of extending bars 332 are rotated together with the adjusting member 120 and sequentially come into contact with the deformation member 340 to deform the deformation member 340.

That is, the plurality of extending bars 332 sequentially deform the deformation member 340 in a clockwise direction to enable the piezoelectric element 150 to generate electricity.

The deformation member 340 is disposed in the internal space of the main body 110 and deformed by the extending bars 332 when the rotary plate 330 rotates. In an embodiment, a plurality of deformation members 340 are disposed spaced apart from one another in the circumferential direction in such a manner that spaces therebetween are gradually increased.

For example, in a case in which the rotary plate 330 is in the original position, a first extending bar 332 and a first deformation member 340 may be disposed to be in contact with each other. An extending bar 332 disposed in a second position in a clockwise direction may be disposed to be spaced apart from a second deformation member 340 by a first interval (a). An extending bar 332 disposed in a third position in the clockwise direction may be disposed to be spaced apart from a third deformation member 340 by a second interval (a+b). An extending bar 332 disposed in a fourth position in the clockwise direction may be disposed to be spaced apart from a fourth deformation member 340 by a third interval (a+b+c).

Accordingly, when the user rotates the adjusting member 120, the plurality of extending bars 332 and the plurality of deformation members 340 are sequentially brought into contact with each other to sequentially deform the plurality of deformation members 340.

The deformation member 340 may be disposed in a fixed portion 342 of the main body 110 and may include a deformation portion 344 extending from the fixed portion 342.

The piezoelectric element 150 may be fixedly installed in the deformation portion 344 and deformed together with the deformation portion 344. In this manner, the piezoelectric element 150 is deformed by the extending bar 332 to generate electricity.

As described above, the wireless switch 100 may be driven with electricity generated by the piezoelectric element 150.

Since the wireless switch 100 may have a simple structure, product reliability may be enhanced and lifespan may be increased.

As set forth above, according to embodiments, the wireless switch 100 may be driven without a separate electricity source by employing the described energy harvesting technique.

The apparatuses, units, modules, devices, and other components illustrated in FIG. 3 that perform the operations described herein with respect to FIG. 3 are implemented by hardware components. Examples of hardware components include controllers, sensors, generators, drivers, and any other electronic components known to one of ordinary skill in the art. In one example, the hardware components are implemented by one or more processors or computers. A processing device or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIG. 3. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

In one or more methods illustrated in FIG. 3 that perform operations described herein with respect to the hardware devices of FIG. 3 are performed by a processing device or a computer as described above executing instructions or software to perform the operations described herein.

For example, instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Only after a fully understanding of the present disclosure, programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures stored in non-transitory media are, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wireless switch, comprising:
an adjusting member configured to rotate;
a rotary plate comprising a first extending bar extending from a surface of the rotary plate and configured to be rotated together with the adjusting member;
plural deformation members configured to be deformed by the first extending bar in response to the rotary plate rotating in a first circumferential direction to cause the first extending bar to contact the plural deformation members;
a first piezoelectric element disposed on the first deformation member and configured to generate electricity when the first deformation member is deformed; and
a radio frequency (RF) communications module unit configured to transmit a signal according to the electricity generated by the first piezoelectric element.

2. The wireless switch of claim 1, wherein the plural deformation members are spaced apart from one another at same respective intervals in a circumferential direction.

3. The wireless switch of claim 2, wherein each of the plural deformation members comprises a fixed portion and a deformation portion extending from the fixed portion.

4. The wireless switch of claim 3, wherein the piezoelectric element is disposed on the deformation portion and configured to be deformed together when the deformation portion deforms.

5. The wireless switch of claim 1, wherein the plural deformation members are respectively spaced apart from one another in a circumferential direction such that spaces between adjacent deformation members are gradually increased.

6. The wireless switch of claim 5, comprising plural extending bars, including the first extending bar, spaced apart from one another in the circumferential direction.

7. The wireless switch of claim 6, wherein the plural extending bars are respectively spaced apart in a circumferential direction such that spaces between adjacent extending bars are gradually increased.

8. The wireless switch of claim 1, further comprising a rectifier electrically connected to the first piezoelectric element and configured to rectify electricity generated by the first piezoelectric element.

9. The wireless switch of claim 8, further comprising a condenser electrically connected to the rectifier and configured to stabilize a rectified current from the rectifier and accumulate corresponding electric charges.

10. The wireless switch of claim 9, further comprising a converter electrically connected to the condenser and configured to convert the electricity from the condenser to a voltage supplied to the RF communications module unit.

11. The wireless switch of claim 1, further comprising:
plural piezoelectric elements, including the first piezoelectric element; and
a sensing unit electrically connected to the plural piezoelectric elements, and configured to sense generation of electricity produced by the plural piezoelectric elements.

12. The wireless switch of claim 11, wherein:
the sensing unit is electrically connected to a control unit; and
the control unit is configured to store electricity generated according to a signal from the sensing unit and control the RF communications module unit to generate a signal corresponding to the respective deformations of the plural piezoelectric elements.

13. The wireless switch of claim 1, comprising:
plural piezoelectric elements, including the first piezoelectric element; and
a sensing unit electrically connected to one or more of the plural piezoelectric elements, and configured to sense deformations of the plural piezoelectric elements.

14. The wireless switch of claim 1, wherein the adjusting member is disposed on a first side of a body.

15. The wireless switch of claim 14, wherein the deformation members are disposed on a second side of the body opposite the first side.

16. A wireless switch, comprising:
an adjusting member configured to rotate;
a rotary plate comprising a first extending bar extending from a surface of the rotary plate and configured to rotate when the adjusting member rotates;
plural deformation members configured to be deformed by the first extending bar in response to the rotary plate rotating in a first circumferential direction;
a first piezoelectric element disposed on the first deformation member and configured to generate electricity upon deformation of the first deformation member;
a rectifier electrically connected to the first piezoelectric element and configured to rectify a current provided to the first piezoelectric element;
a condenser electrically connected to the rectifier and configured to stabilize a resulting rectified current from the rectifier and accumulate corresponding electric charges;
a converter configured to convert current from the accumulated corresponding electric charges to a voltage; and
a radio frequency (RF) communications module unit configured to be driven by the voltage provided from the converter and selectively transmitting a signal according to the generated electricity of the first piezoelectric element.

17. The wireless switch of claim 16, wherein the plural deformation members are spaced apart at a same interval in a circumferential direction.

18. The wireless switch of claim 16, wherein the plural deformation members are respectively spaced apart in a circumferential direction such that spaces between adjacent deformation members are gradually increased.

19. The wireless switch of claim 18, further comprising plural extending bars, including the first extending bar,
wherein the plural extending bars are arranged in a corresponding circumferential direction so that portions of the plural extending bars that contact the plural deformation members are differently spaced from a nearest deformation member of the plural deformation members.

20. A method, the method comprising:
generating electricity in a select piezoelectric element of plural piezoelectric elements in response to deformation of a deformation member, of plural deformation members of a wireless switch, by rotation of an adjusting member of the wireless switch; and
controlling transmission of a radio frequency (RF) signal to an external electronic device to selectively operate the electronic device, between different operatings of the electronic device, based on differing amounts of electricity generated in response to respective deformations of the deformation members.

* * * * *